(12) United States Patent
Salle et al.

(10) Patent No.: US 9,720,074 B2
(45) Date of Patent: Aug. 1, 2017

(54) CIRCUITRY FOR AND METHOD OF GENERATING A FREQUENCY MODULATED RADAR TRANSMITTER SIGNAL, A RADAR TRANSCEIVER CIRCUIT AND A RADAR SYSTEM

(71) Applicants: Didier Salle, Toulouse (FR); Olivier Doare, La Salvetat St Gilles (FR); Christophe Landez, Toulouse (FR)

(72) Inventors: Didier Salle, Toulouse (FR); Olivier Doare, La Salvetat St Gilles (FR); Christophe Landez, Toulouse (FR)

(73) Assignee: NXP USA, Inc., Austin, TX (US)

( * ) Notice: Subject to any disclaimer, the term of this patent is extended or adjusted under 35 U.S.C. 154(b) by 413 days.

(21) Appl. No.: 14/324,322

(22) Filed: Jul. 7, 2014

(65) Prior Publication Data

US 2015/0219753 A1    Aug. 6, 2015

(30) Foreign Application Priority Data

Feb. 5, 2014    (WO) .................. PCT/IB2014/000173

(51) Int. Cl.
*G01S 7/40* (2006.01)
*G01S 13/02* (2006.01)
(Continued)

(52) U.S. Cl.
CPC ............ *G01S 7/4008* (2013.01); *G01S 7/032* (2013.01); *G01S 13/02* (2013.01); *G01S 13/343* (2013.01);
(Continued)

(58) Field of Classification Search
CPC .................................................. G01S 7/4008
(Continued)

(56) References Cited

U.S. PATENT DOCUMENTS 6,853,261 B1 * 2/2005 Ling ........................ H03L 7/099
331/100
7,298,219 B2 * 11/2007 Dosho ................... H03L 7/0898
327/157
(Continued)

FOREIGN PATENT DOCUMENTS

DE    102008009596 A1    8/2009

OTHER PUBLICATIONS

Collins, D. et al. "Fast Frequency Calibration of VCO's in Phase-Locked Loops" ISSC 2010; Jun. 21-24, 2010; ISBN 978-1-84919-252-1.

*Primary Examiner* — Marcus Windrich
(74) *Attorney, Agent, or Firm* — Charlene R. Jacobsen

(57) ABSTRACT

A circuitry for and a method of generating a frequency modulated radar transmitter signal are provided. The circuitry comprises a modulation signal generator for generating a modulation signal having a waveform describing a required frequency modulation of the frequency modulated radar transmitter signal and comprises a PLL circuitry for generating the frequency modulated radar transmitter signal in dependence of the modulation signal. In the PLL circuitry a controllable frequency divider controls the output frequency of the PLL circuitry in dependence of the modulation signal. The PLL circuitry further comprises a phase detector, a controllable oscillator and possibly a low pass filter. The PLL circuitry further comprises a calibration circuitry being configured to control a parameter of at least one of the phase detector and the controllable oscillator to maintain a loop gain of PLL circuitry.

16 Claims, 4 Drawing Sheets

(51) Int. Cl.
  *G01S 7/03*  (2006.01)
  *G01S 13/34* (2006.01)
  *H03C 3/09*  (2006.01)
  G01S 13/58  (2006.01)
  G01S 13/93  (2006.01)
(52) U.S. Cl.
  CPC .......... *H03C 3/0925* (2013.01); *G01S 13/584* (2013.01); *G01S 13/931* (2013.01)
(58) Field of Classification Search
  USPC ................................................ 342/174, 200
  See application file for complete search history.

(56) References Cited

U.S. PATENT DOCUMENTS

| | | | |
|---|---|---|---|
| 7,772,930 B2* | 8/2010 | Gatta | H03L 7/0898 327/157 |
| 2009/0072911 A1* | 3/2009 | Ke | H03L 7/087 331/16 |
| 2011/0090998 A1* | 4/2011 | Zhang | H03L 7/093 375/365 |
| 2011/0102090 A1* | 5/2011 | Yen | H03C 3/0916 331/2 |
| 2012/0319889 A1* | 12/2012 | Kobayashi | G01S 13/345 342/118 |
| 2014/0266345 A1* | 9/2014 | Matsumura | G01S 7/4056 327/158 |

* cited by examiner

US 9,720,074 B2

CIRCUITRY FOR AND METHOD OF GENERATING A FREQUENCY MODULATED RADAR TRANSMITTER SIGNAL, A RADAR TRANSCEIVER CIRCUIT AND A RADAR SYSTEM

CROSS REFERENCE TO RELATED APPLICATIONS

The present application claims priority to International Application No. PCT/IB2014/000173, filed on Feb. 05, 2014, entitled "CIRCUITRY FOR AND METHOD OF GENERATING A FREQUENCY MODULATED RADAR TRANSMITTER SIGNAL, A RADAR TRANSCEIVER CIRCUIT AND A RADAR SYSTEM," the entirety of which is herein incorporated by reference.

FIELD OF THE INVENTION

This invention relates to circuitry for and method of generating a frequency modulated radar transmitter signal for frequency-modulated continuous-wave radar systems. The invention further relates to an integrated circuit, to a radar transceiver circuitry and to a radar system.

BACKGROUND OF THE INVENTION

Frequency-modulated continuous-wave (FMCW) radar is a measuring radar that is capable of determining distance and/or relative speed. For example, in vehicles like cars and trucks, frequency-modulated continuous-wave radar systems are used to detect a distance to other objects and to measure a relative speed with respect to other vehicles. The output of such radar systems is used to generate warning signals for warning the driver and/or to automatically intervene in dangerous situations. In FMCW systems the transmitted signal (round a known stable frequency continuous wave) varies up (and down) in frequency over a fixed period of time-frequency modulation refers in this document to the varying of the frequency of the continuous wave. A chirp time is the length of the time interval in which the frequency increases (and decreases). Several types of frequency modulations are known in the field of FMCW radar. For example, in slow frequency modulation, the frequency of the transmitted continuous wave is modulated according to a triangular shaped wave and a chirp time is relatively long, for example, 10 milliseconds. In fast frequency modulation the frequency of the transmitted continuous wave is modulated according to a sawtooth wave and the chirp time is relatively short, for example, 100 microseconds. An effect of fast frequency modulation is that the beat frequency is increased while the Doppler frequency remains the same compared to the slow frequency modulation.

In published German patent application DE102008009596A1 a circuitry is disclosed for generating a frequency modulated continuous wave signal for a radar system that is frequency modulated according to a sawtooth-like waveform. However, the disclosed circuitry is not robust against external perturbations and variations.

SUMMARY OF THE INVENTION

The present invention provides a circuitry for and a method of generating a frequency modulated radar transmitter signal as described in the accompanying claims. Other aspects of the invention are an integrated circuit, a radar transceiver circuitry, a radar system and a method of generating a frequency modulated radar transmitter signal as described in the claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale. In the Figures, elements which correspond to elements already described may have the same reference numerals.

DETAILED DESCRIPTION OF THE PREFERRED EMBODIMENTS

Figure 1:
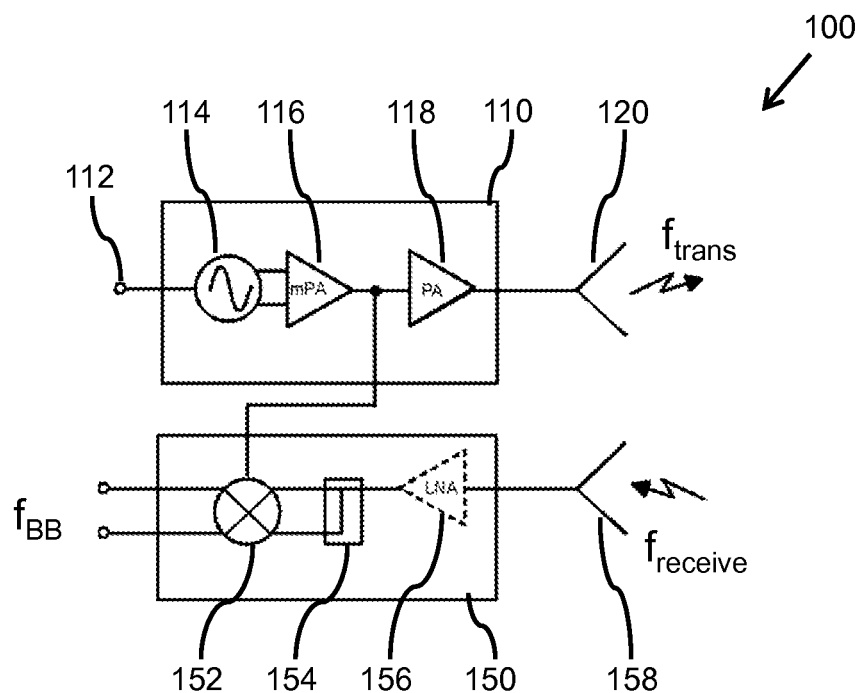
FIG. 1 schematically shows an example of an embodiment of a radar transceiver.

FIG. 1 schematically shows an example of an embodiment of a radar transceiver 100. The radar transceiver 100 comprises a transmitter 110 and a receiver 150. The transmitter 110 is coupled to a transmitter antenna 120 which transmits the signal generated by the transmitter 110. The receiver 150 is coupled to a receiver antenna 158 which provides a received signal to the receiver 150.

The transmitter 110 comprises an input 112 for receiving a reference signal that must be transmitted by the radar transceiver 100. In subsequent embodiment (e.g. FIGS. 3 and 4) an input node 301 may perform the function of input 112. The reference signal is provided to an oscillator 114 which generates a high frequency signal. The oscillator 114 typically uses a factor x multiplying Phase Locked Loop circuitry to generate the high frequency signal and the reference signal is an input to the multiplying Phase Locked Loop circuitry and forms a base for generating the multiplied frequency. In the subsequent embodiments (e.g., FIGS. 3 and 4), a circuitry for generating a frequency modulated radar transmitter signal replaces the oscillator 114. The signal is provided to a first power amplifier 116 for amplifying the generated high frequency signal to a first power level and the output of the first power amplifier 116 is provided to a second power amplifier 118 which finally amplifies the generated high frequency signal to the required output level. The output signal of the first power amplifier 116 is also provided to the receiver 150 for use in a demodulation of the received signal.

The receiver 150 comprises a low noise amplifier 156 for amplifying the received signal without introducing noise in the bandwidth of the received signal. The amplified received signal is provided to a differential signal generator 154 which generates a differential signal of the amplified received signal. The differential signal is provided to a demodulator 152 which demodulates the differential signal to a baseband signal $f_{bb}$.

Figure 2:
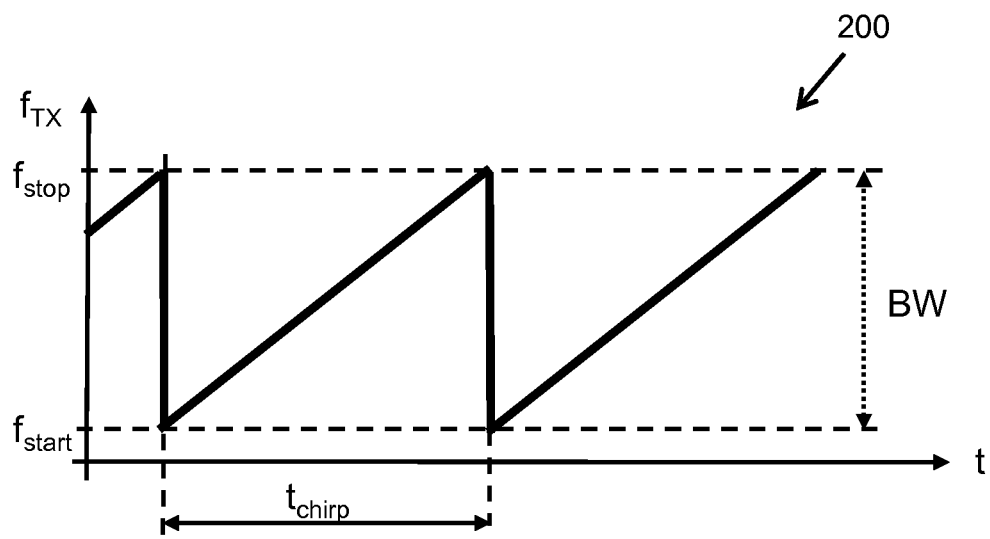
FIG. 2 schematically shows an embodiment of a radar transmitter frequency pattern, FIG. 3 schematically shows an embodiment of a radar transmitter system comprising a circuitry for generating a frequency modulated radar transmitter signal, FIG. 4 schematically shows another embodiment of a radar transmitter system comprising a circuitry for generating a frequency modulated radar transmitter signal, FIG. 5 schematically shows an embodiment of a method of generating a frequency modulated radar transmitter signal.

FIG. 2 schematically shows an embodiment of a radar transmitter frequency pattern 200. The x-axis represents the dimension of time, the y-axis represents a frequency of a transmitted radar signal. In an example of Frequency-modulated continuous-wave (FMCW) radar the frequency of the transmitted radar signal is frequency modulated according to the pattern 200 shown in FIG. 2. Repeatedly, during subsequent period of time having a predetermined length of time $t_{chirp}$, the frequency of the transmitted radar signal linearly increases from a lower frequency $f_{start}$ to a higher frequency $f_{stop}$ (after which the frequency of the transmitted radar signal starts again at the lower frequency $f_{start}$ and linearly increases toward the higher frequency $f_{stop}$, etc.). The frequency range from the lower frequency $f_{start}$ to the higher frequency $f_{stop}$ is termed the bandwidth BW of the transmitted radar signal. The predetermined length of time (chirp time, $t_{chirp}$) can be smaller than 1 millisecond, for example, 100 μs or less. Radio spectrum regulations define in which spectral range radar signals may be emitted for specific radar applications. In automotive applications, a distinction is made between long range radar and short range radar. Typical automotive applications of long radar are adaptive cruise control and stationary object detection. The range of the automotive long range radar (LRR) is typically over 50 meters, such as 100 meters or more, for example between 200 and 250 meters, and less than 500 meters. The resolution of LRR is typically 1 meter or less, and e.g. above 0.2 meters, such as 0.5 meters or coarser. Typical automotive applications for short range radar are pedestrian detection, parking assist, blind spot detection and collision mitigation/avoidance. The range of the automotive short range radar (SRR) is typically less than 50 meters, such as 30 meters or less, for example between 0.1 meter and 30 meter. The resolution of SRR is typically 0.2 meters of less, such as 0.1 meter or less. In FMCW radar, range resolution is inversely proportional to the bandwidth of modulation. In long range radar, the authorized radio spectral range is from 76 GHz to 77 GHz, and, to be compliant with the radio spectrum regulations, the lower frequency $f_{start}$ may be equal to 76 GHz and higher $f_{stop}$ may be equal to 77 GHz. Long range radar covers distances up to 250 meter. In short range radar applications, the authorized spectral range is van 77 GHz to 81 GHz, and, in theory, this allows a lower frequency $f_{start}$ of 77 GHz and a higher frequency $f_{stop}$ of 81 GHz. In practical cases, in short range radar a difference between the lower frequency $f_{start}$ and the higher frequency $f_{stop}$ is about 2 GHz. Short range radar covers distances up to 30 meter. The provided examples of lower frequency $f_{start}$ and the higher frequency $f_{stop}$ are examples that are based on the radio spectrum regulations. Other lower frequency $f_{start}$ and higher frequency $f_{stop}$ may be used as well, for example, when other spectral ranges are appointed in the radio spectrum regulations.

In the following, for sake of understanding, the circuitry is described in operation. However, it will be apparent that the respective elements are arranged to perform the functions being described as performed by them.

Figure 3:
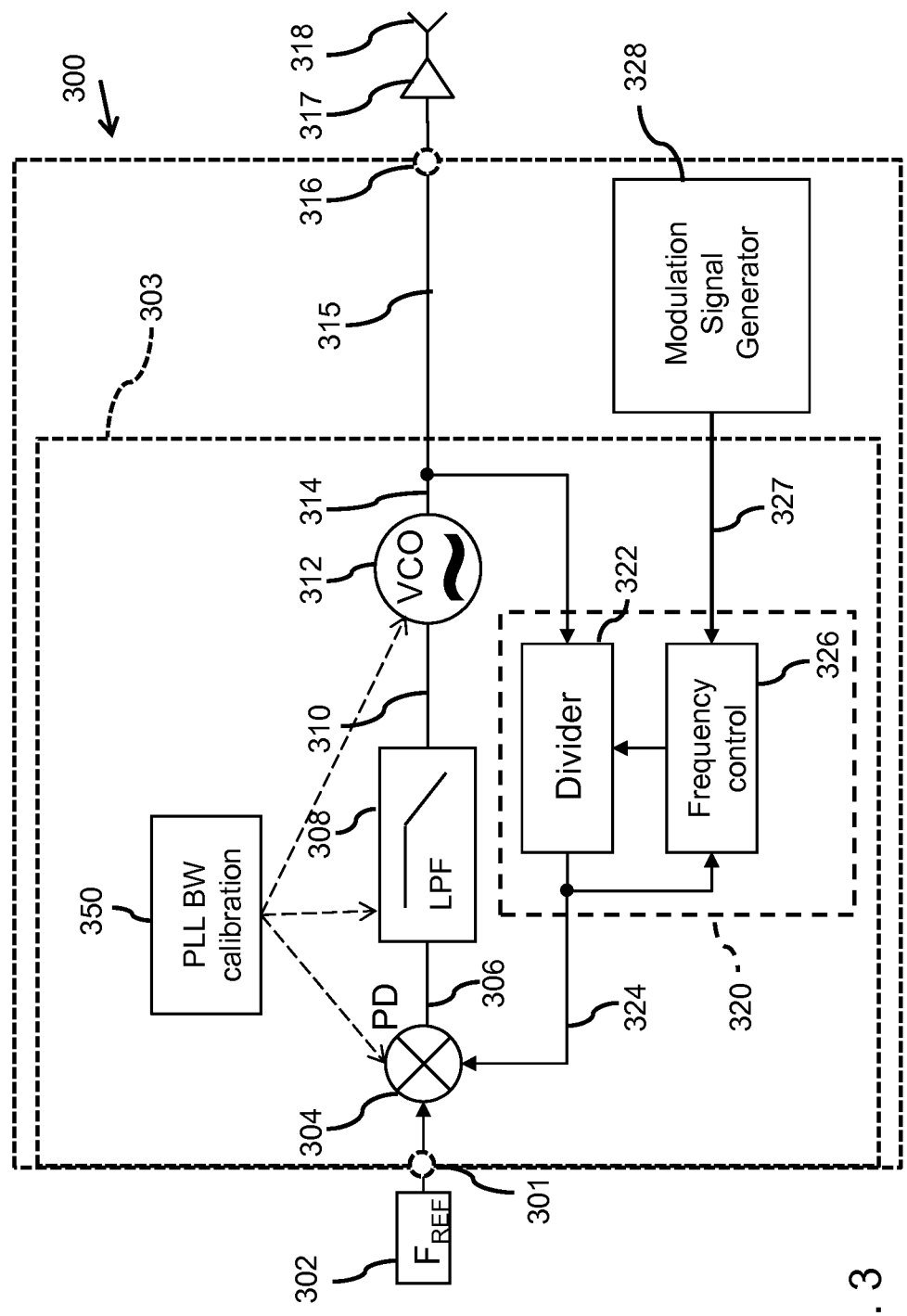

FIG. 3 schematically shows an embodiment of a radar transmitter system comprising a circuitry 300 for generating a frequency modulated radar transmitter signal. The circuitry 300 comprises a circuitry output 316 at which the generated frequency modulated radar transmitter signal is provided to a power amplifier 317 to amplify the frequency modulated radar transmitter signal 315 towards a required power level before providing the frequency modulated radar transmitter signal to a radar transmitter antenna 318.

The circuitry 300 further comprises a reference input 301 for receiving a reference signal that has a reference frequency. The reference signal is, for example, generated by an oscillator 302 which generates a signal having the reference frequency.

The circuitry 300 further comprises a modulation signal generator 328 which generates a modulation signal 327. The modulation signal 327 has a specific waveform which describes a required frequency modulation of the generated frequency modulated radar transmitter signal 315. The modulation signal 327 may be an analog signal and by way of a predefined definition it may be defined which voltage of the modulation signal 317 indicate a specific required frequency to be generated by the circuitry 300, and thus, where the frequency of the generated frequency modulated radar transmitter signal 315 is a function of that voltage. The modulation signal 327 may also be a digital signal which describes the required frequency of the generated frequency modulated radar transmitter signal 315 e.g. by way of a numerical value. The modulation signal 327 may, for example, have a sawtooth waveform which describes a required frequency modulation according to the radar transmitter frequency pattern 200 of FIG. 2.

The circuitry 300 further comprises a Phase Locked Loop (PLL) circuitry 303. The PLL circuitry 303 generates the frequency modulated radar transmitter signal 315 in dependence of the modulation signal 327. The PLL circuitry 303 comprises a forward loop with controllable oscillator 312, VCO, a phase detector 304, PD, a feedback loop with a controllable frequency divider 320 and further comprises a calibration circuitry 350.

The controllable oscillator 312, VCO is arranged to receive a control voltage 310 and to generate a PLL output signal 314 at its oscillator output in dependence of the control voltage 310. More in particular, a frequency of the generated signal 314 varies according to variations of the control voltage 310. The controllable oscillator 312, VCO is, for example, implemented as a Voltage Controlled Oscillator. It is to be noted that the generated signal 314 is provided by the PLL circuitry 303 as the frequency modulated radar transmitter signal 315.

The phase detector 304, PD generates the control voltage 306, 310 in dependence of a feedback signal 324 and a reference signal received at the reference input 301. The control voltage 306 represents a phase difference between the feedback signal 324 and the reference signal. In a practical embodiment, in between the phase detector 304, PD and the controllable oscillator 312 is provided a low pass filter circuit 308, LPF which reduces the presence of high frequency components in the output signal of the phase detector 304, PD thereby generating the control voltage 310 in which high frequency components (e.g. noise) are filtered out (at least the high frequency components are partially suppressed). The low pass filter circuit 308, LPF allows to obtain a stable PLL circuitry.

The controllable frequency divider 320 receives from the controllable oscillator VCO, 312 the generated signal 314 and generates the feedback signal 324. A frequency of the generated signal 314 is divided by a controllable factor and, thus, a frequency of the feedback signal is substantially equal to the frequency of the generated signal 314 divided by the controllable factor. The controllable frequency divider 320 receives the modulation signal 327 and the controllable factor depends on the modulation signal 327. As shown in FIG. 3, the controllable frequency divider 320 may comprise a controllable frequency sub-divider 322 which divides the frequency of the generated signal 314 by the controllable factor and comprises a frequency control circuit 326 which generates the controllable factor. The frequency control circuit 326 generates the controllable factor in dependence of the received modulation signal 327. In an example, the frequency control circuit 326 is configured to measure a frequency of the feedback signal 324 and generate the controllable factor in dependence of the measured frequency of the feedback signal 324 and in dependence of the received modulation signal 327. When the measured frequency deviates from the required frequency as indicated by the received modulation signal 327, the controllable frequency is adapted to obtain at an output of the frequency divider 322 a signal with a frequency that is closer to the required frequency.

The above described PLL circuitry 303 is a robust circuitry for generating the frequency modulated radar transmitter signal 315. By continuously varying the controllable (dividing) factor of the controllable frequency divider 320 in dependence of the modulation signal 327, the frequency of the frequency modulated radar transmitter signal 315 is modulated according to the modulation signal 327. In the above PLL circuitry 303, the modulation of the frequency is generated within the PLL circuitry 303. This allows the response of the PLL circuitry 303 to frequency changes to be relatively equal along the different frequencies in between the lowest frequency and the highest frequency of the frequency modulated radar transmitter signal 315. The PLL circuitry 303 also comprises a calibration circuitry 350 which is configured to maintain a predefined PLL circuitry bandwidth by maintaining the loop gain close to a specific (predefined) value while parameters of the PLL circuitry vary. Thereby, the bandwidth of the PLL circuitry may be kept relatively constant in varying ambient conditions. The bandwidth of a PLL typically strongly depends on a gain of the PLL (which is the product of the gains of elements in the forward loop). This gain may vary when environmental parameters (such as temperature) vary or when a supply voltage to the PLL circuitry 303 varies. For example, a controllable oscillator is typically relatively sensitive to temperature variations.

For example, when the gain of the forward loop varies because of temperature changes, the calibration circuitry 350 may control one of the elements of the PLL circuitry 303 to correct for a change in the gain such that the gain of the forward loop is maintained. The elements of which parameters may be controlled are, for example, the phase detector 304, PD, the low pass filter 308, LPF and the controllable oscillator 312, VCO. For example, the calibration circuitry 350 may maintain the loop gain by maintaining a product of several gains of elements of the PLL circuitry 303 as constant as possible across all frequencies that are generated by the circuitry 300 (e.g., in the range between the lower frequency and the higher frequency of a required modulation pattern of, for example, FIG. 2). For example, a product of a gain of the phase detector PD, 304 and of the controllable oscillator VCO, 312 is maintained as constant as possible. Alternatively, a product of a gain of the low pass filter LPF, 308 and the gain of the controllable oscillator VCO, 312 is maintained as constant as possible. In yet another alternative, a product of the gain of the phase detector PD, 304, the gain of the low pass filter LPF, 308 and of the controllable oscillator VCO is maintained as constant as possible. Maintaining such constant products can be obtained by controlling, for example, the gain of the controllable oscillator VCO, 312, of the gain of the loss pass filter LPF, 308 or the gain of the phase detector PD, 304.

Figure 4:
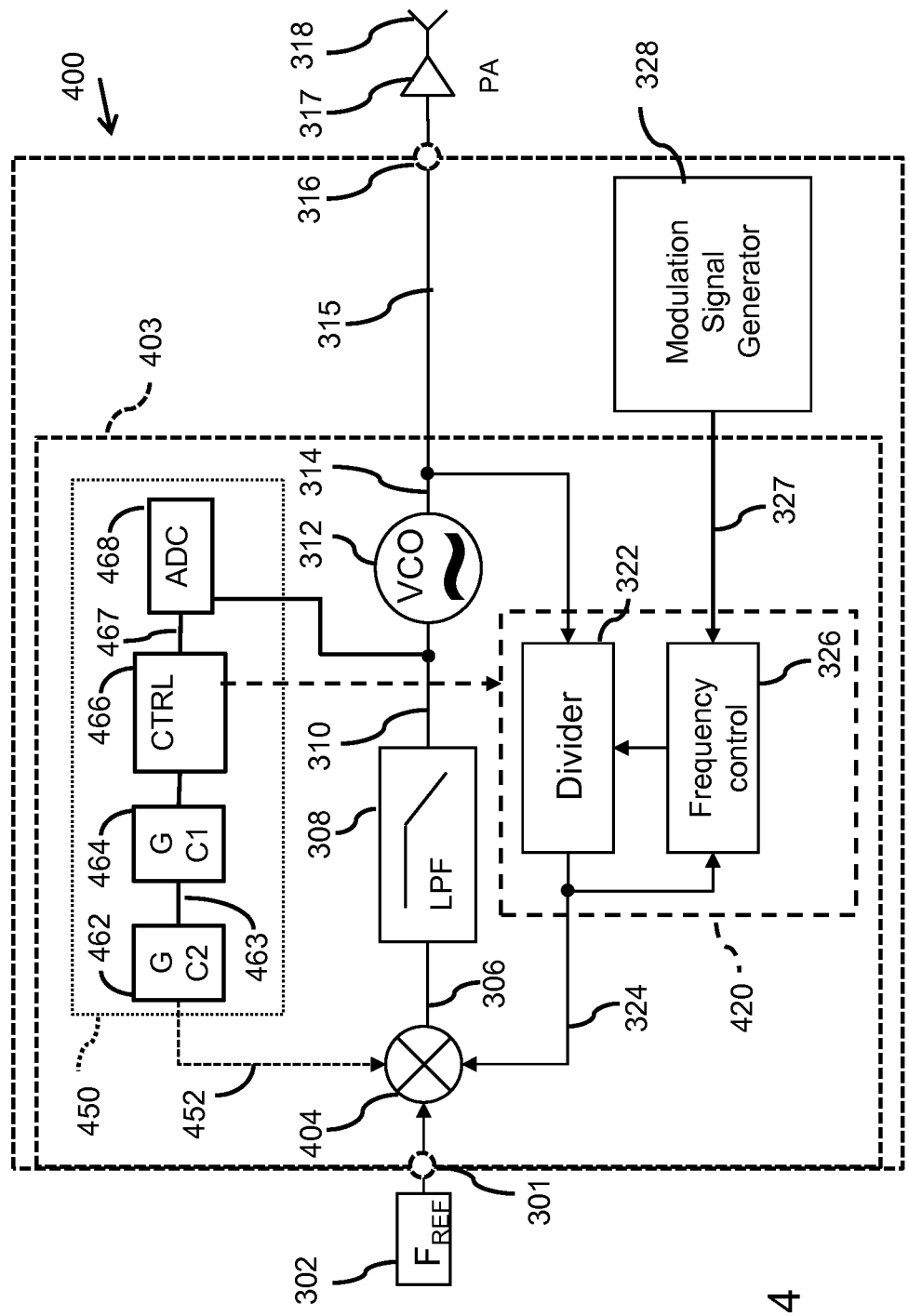

FIG. 4 schematically shows another embodiment of a radar transmitter system which comprises a circuitry 400 for generating a frequency modulated radar transmitter signal 315. Except for the calibration circuitry 450, the presented example is similar to the example of FIG. 3 The phase detector is a controllable phase detector 404 of which a gain can be controlled. When such a phase detector is present, the calibration circuitry 450 can be, as in the example, configured to control the gain of the phase detector to maintain the loop gain based on detected variations in the gain of the controllable oscillator 312. The calibration circuitry 450 may generate a gain control signal 452 which is provided to the controllable phase detector 404 for controlling the gain of the phase detector 404. The gain control signal 452 indicates a required gain for the controllable phase detector 404. For example, it may be pre-programmed in the calibration circuitry what the product of the gain of the controllable oscillator 312 and of the gain of the controllable phase detector 404 should be, and when the gain of the controllable oscillator 312 is measured, the product is divided by the measured gain of the controllable oscillator 312 to obtain a value for the required gain for the controllable phase detector 404.

The controllable phase detector 404 may comprise a charge pump which has a specific charge-pump gain. The calibration circuitry 450 may control the gain of the phase detector by controlling the charge-pump gain with the gain control signal 452. This is, for example, discussed in US patent application publication US2009/0072911A1, the content of which are incorporated by reference.

The calibration circuitry 450 may be configured to perform a method of determining a gain of the controllable oscillator 312 by: i) controlling the PLL circuitry 403 to generate a first frequency $f_1$ which is at least within a lower half portion of the modulation bandwidth, ii) measure the control voltage 310 for obtaining a first control voltage measurement $V_1$, iii) control the PLL circuitry 403 to generate a second frequency $f_2$ which is at least within a higher half portion of the modulation bandwidth, iv) measure the control voltage 310 for obtaining a second control voltage measurement $V_2$, v) calculate a gain of the controllable oscillator 312 in dependence of the values of the first frequency $f_1$, the second frequency $f_2$, the first control voltage measurement $V_1$ and second control voltage measurement $V_2$, vi) adapt the gain of the phase detector 404 such that a product of the gain of the phase detector 404 and the gain of the controllable oscillator 312 is substantially equal to a predetermined constant. Controlling the PLL circuitry 403 to generate a specific frequency may be done by providing to the controllable frequency divider 420 a control signal which indicates that the PLL circuitry 403 has to generate the specific frequency. In response to such a received control signal, the controllable frequency divider 420 may adapt the controllable factor by which the frequency of the generated signal 314 is divided to obtain the feedback signal 324. The calculation of the gain of the controllable oscillator 312 may be performed by using the subsequent formula:

$$G_{VCO} = \frac{f_2 - f_1}{v_2 - v_1}.$$

In an embodiment, the first frequency $f_1$ is substantially equal to a lowest frequency $f_{start}$ of the frequency modulation that is indicated by the modulation signal 327, thus, the lowest frequency at which the frequency modulated radar transmitter signal is modulated under normal operation. In an embodiment, the second frequency $f_2$ is substantially equal to a highest frequency $f_{stop}$ of the frequency modulation that is indicated by the modulation signal 327, thus, the lowest frequency at which the frequency modulated radar transmitter signal is modulated under normal operation. In another example, the first frequency $f_1$ is substantially equal to an average of the lowest frequency $f_{start}$ and the highest frequency $f_{stop}$ minus a predetermined frequency difference $$\Delta f\left(f1 = \frac{f_{start} + f_{stop}}{2} - \Delta f\right)$$

and the second frequency $f_2$ is substantially equal to an average of the lowest frequency $f_{start}$ and the highest frequency $f_{stop}$ plus the predetermined frequency difference $$\Delta f\left(f2 = \frac{f_{start} + f_{stop}}{2} + \Delta f\right).$$

At least the predetermined frequency difference $\Delta f$ is low enough to obtain a variation of the gain of controllable oscillator $G_{VCO}$ that is about linear in between the first frequency $f_1$ and the second frequency $f_2$.

The calibration circuitry 450 may comprise an Analogue-to-Digital Converter ADC, 468 which converts the analogue value of the control voltage 310 to a digital value 467. The predetermined frequency difference $\Delta f$ is high enough, when two frequencies are generated that are at least the predetermined frequency difference $\Delta f$ separated from each other, to generate a variation in the voltage of the control signal 310 that is higher than the resolution of the Analogue-to-Digital Converter ADC, 468. The resolution is the minimum voltage difference that may be detected by the Analogue-to-Digital Converter ADC, 468. Thereby it may be avoided that the first control voltage measurement $V_1$ is equal to the second voltage measurement $V_2$, and, thus, no gain of the controllable oscillator 312 can be calculated.

The calibration circuitry 450 may comprise a controller CTRL, 466. The digital value 467 is, for example, provided to the controller CTRL, 466. The controller CTRL 466 may control the calibration process in which elements of the PLL circuitry 403 are controlled to maintain the loop gain of the PLL circuitry. In particular, as discussed above, the calibration circuitry 450 may need to control the frequency which is generated by the PLL circuitry 403 to perform the calibrations. The controller CTRL, 466 may perform this control. At certain moments in time, the controller CTRL, 466 provides a specific signal to the controllable frequency divider 420 that the first frequency $f_1$ or the second frequency $f_2$ is to be generated. When the frequency divider 420 receives such a signal from the controller CTRL, 466, it controls the controllable (dividing) factor to a value which should result in the generation of the requested frequency. This is done in a similar way as when the controllable frequency divider 420 receives the modulation signal 327 from the modulation signal generator 328. Shortly after providing such a signal to the controllable frequency divider, the controller CTRL (but sufficiently long thereafter for the PLL to settle), 466 reads the digital value 467 which it receives from the analogue-to-digital converter ADC, 468 to obtain the first control voltage measurement $V_1$ and second control voltage measurement $V_2$. The first control voltage measurement $V_1$, second control voltage measurement $V_2$ and the value of the first frequency $f_1$ and the second frequency $f_2$ may be provided to a first gain calculator GC1, 464 which calculates the gain of the controllable oscillator VCO, 312 by using the above discussed formula. In a first gain signal 463 the value of the gain $G_{VCO}$ of the controllable oscillator VCO, 312 is provided to a second gain calculator GC2, 462 which calculates a required gain for the phase detector 404. This required gain for the phase of the phase detector 404 is, for example, calculated by $$G_{PD} = \frac{\text{constant\_product}}{G_{VCO}},$$

wherein constant_product is a predefined required constant product of the controllable oscillator gain $G_{VCO}$ and the phase detector gain $G_{PD}$. The second gain calculator GC2, 462 generates the gain control signal 452 which is provided to the phase detector 404 for controlling phase detector gain $G_{PD}$ in accordance with the calculated phase detector gain $G_{PD}$. It is to be noted that the above discussed procedure may be performed in a very short period of time, for example, within 200 microseconds, 120 microsecond, or 80 microseconds.

In an embodiment of the controller CTRL, 466 is able to adapt the first frequency $f_1$ and the second frequency $f_2$ to obtain a better calibration of the PLL circuitry. In the following of this paragraph it is assumed that the first voltage measurement $V_1$ and the second control voltage measurement $V_2$ are obtained at the first frequency $f_1$, that is substantially equal to a lowest frequency $f_{start}$ of the frequency modulation and at the second frequency $f_2$ that is substantially equal to a highest frequency $f_{stop}$ of the frequency modulation. The controller CTRL, 466 may determine whether $V_2-V_1$ is lower than the resolution of the Analogue-to-Digital Converter ADC, 468 and if so, new values for the first frequency $f_1$ and the second frequency $f_2$ are calculated by using the subsequent formulas:

$$f1 = \frac{f_{start} + f_{stop}}{2} - \Delta f \text{ and } f2 = \frac{f_{start} + f_{stop}}{2} + \Delta f,$$

wherein $\Delta f$ is the predetermined frequency difference. After calculating new values for the first frequency $f_1$ and the second frequency $f_2$, the PLL circuitry 403 is controlled to generate a signal having the first frequency $f_1$, the control voltage 310 is measured for obtaining the first control voltage measurement $V_1$ when the signal having the first frequency $f_1$ is generated, the PLL circuitry 403 is controlled to generate a signal having the second frequency $f_2$, the control voltage 310 is measured for obtaining a second control voltage measurement $V_2$ when the signal having the second frequency $f_2$ is generated. These newly measured first control voltage measurement $V_1$ and second control voltage measurement $V_2$ are subsequently used for calculating the gain of the controllable oscillator VCO, 312.

In the above example, the gain of the phase detector 404 is controlled by the gain controlling signal 452. As discussed in the context of the example illustrated in FIG. 3, the calibration circuitry 350 may also control other elements of the PLL circuitry 303, 403. For example, if a low-pass filter 308 is present in between the phase detector 304, 404 and the controllable oscillator VCO, 312, and if the low-pass filter 308 comprises passive components such as resistors, capacitors and/or inductors which influence the gain of the low-pass filter 308, the calibration circuitry 350, 450 may connect or disconnect one or more of these resistor, capacitors and/or inductors in order to influence a gain of the low-pass filter 308 such that a product of a gain of the controllable oscillator VCO, 312 and the gain of the low-pass filter 308 is substantially constant. Determining which resistors, capacitors and/or inductors must be connected or disconnected may be done by calculating a required gain for the low-pass filter 308 in line with the above discussed embodiment of FIG. 4 and subsequently determining how the different resistors, capacitors and/or inductors influence the gain of the low-pass filter 308 to decide which resistors, capacitors and/or inductors must be connected or disconnected. The controllable oscillator may not only be controllable with respect to the frequency that it generates in dependency a received control voltage, it may also with respect to a second control voltage received from the calibration circuitry 350, 450 which second control voltage also influences the frequency of the generated signal in accordance with a specific relationship.

The calibration can be performed when the circuitry 300, 400 for generating a frequency modulated radar transmitter signal is not used to generate a frequency modulated radar transmitter signal. Thereby disturbances of the frequency modulated radar transmitter signal may be avoided. Such moments in time may be: i) when the circuitry 300, 400 for generating is switched on, which means, when it receivers power after a period of time that it did not receive any power; ii) directly before the frequency modulated radar transmitter signal is to be generated; consequently, this moment in time depends on a reception of a command to generate the frequency modulated radar transmitter signal— the command may, for example, be received from a radar system controller; iii) in between two chirps of the generated frequency modulate radar transmitter signal because the time to perform the calibration is relatively short, or iv) after significant changes have been detected in a temperature of the circuitry 300, 400 or in a level of the supply voltage of the circuitry 300, 400 which also implies that temperature or voltage measurement circuits are provided which provide a temperature or supply level signal to, for example, the controller CTRL, 466.

In general, the controller CTRL, 466 may be configured to determine at which moments in time the calibration must be performed. Further, a controllable switch may be provided in the circuitry 300, 400 in between the controllable oscillator VCO, 312 and the circuitry output 316. This controllable switch may be controlled to be in a non-conductive mode during the calibration of the PLL circuitry 303, 404 by the calibration circuitries 350, 450 and to be controlled in a conductive mode when the circuitry 300, 400 for generating the frequency modulated radar transmitter signal is being generated. Such controlling may be done by a controller of a radar system or may be performed by the controller CTRL, 466 of the calibration circuitry 450.

It is to be noted that the circuitry 300, 400 of FIGS. 3 and 4, respectively, may be completely, or partially, integrated in an integrated circuit. The circuitry 300, 400 of FIGS. 3 and 4 may be integrated on a single die, or may be provided on multiple dies. Furthermore, the circuitry 300, 400 may be provided in a transceiver of a radar system. Such a radar system can, for example, be a Frequency Modulated Continuous Wave radar system.

Figure 5:
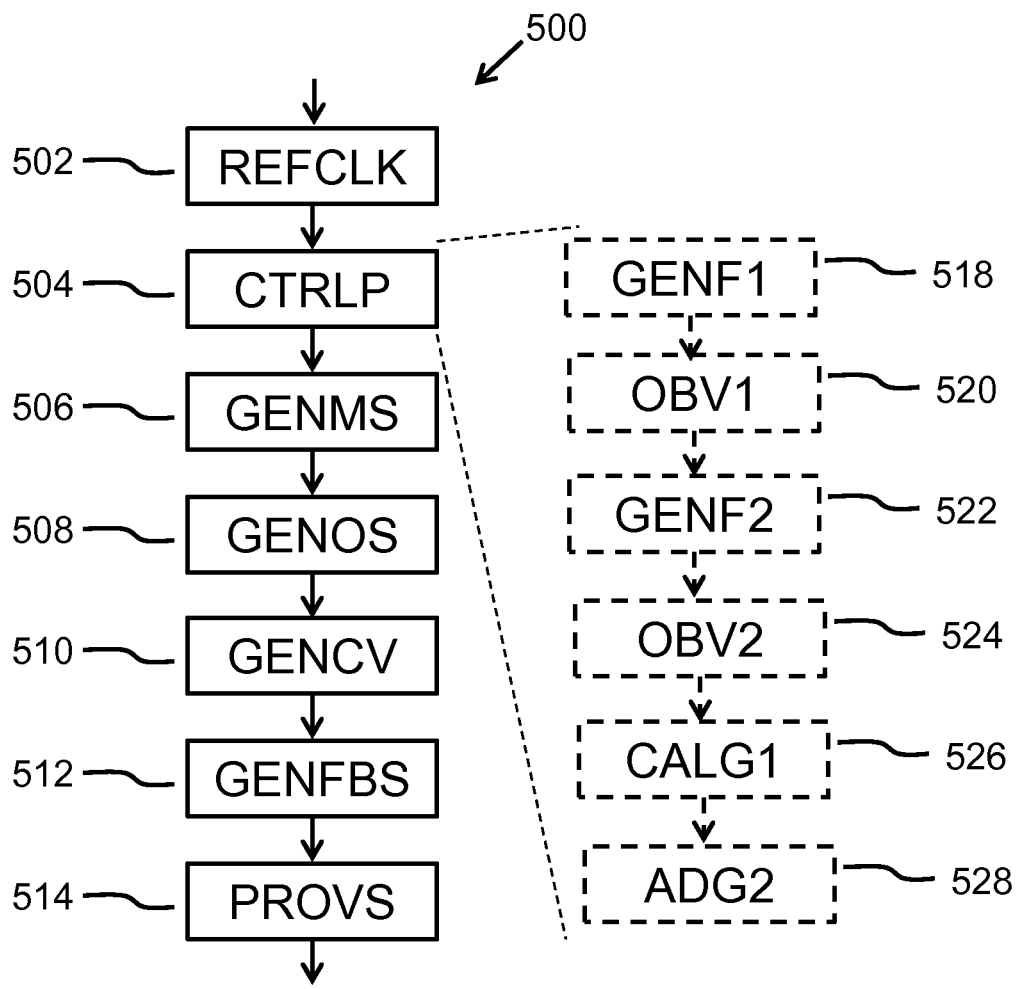

FIG. 5 schematically shows an embodiment of a method 500 of generating a frequency modulated radar transmitter signal. The method comprises: 1) receiving REFCLK, 502 a reference signal having a reference frequency, 2) controlling CTRLP, 504 a parameter of at least one of a phase detector and a controllable oscillator to maintain a loop gain of the PLL circuitry comprising the phase detector and the controllable oscillator, 3) generating GENMS, 506 a modulation signal having a waveform describing a required frequency modulation of the frequency modulated radar transmitter signal, 4) generating GENOS, 508 a signal at an oscillator output of the controllable oscillator in dependence of a control voltage, 5) generating GENCV, 510 the control voltage by means of the phase detector in dependence of a phase difference between a feedback signal and the received reference signal, 6) generating GENFBS, 512 the feedback signal by means of a controllable frequency divider, the generated feedback signal having a frequency being substantially equal to a frequency of the generated signal at the oscillator output divided by a controllable factor, the controllable factor being dependent on the generated modulation signal, 7) providing PROVS, 514 the generated signal of the oscillator output as the frequency modulated radar transmitter signal. It is to be noted that although it seems that the above stages are executed in a particular order, the generating of the frequency modulated radar transmitter signal is a continuous process in which parts are performed for some time in parallel. The controlling CTRL, 504 the parameter of at least one of the phase detector and the controllable oscillator may be executed at another moment in time that the interval in time when the frequency modulated radar transmitter signal is generated. As will be discussed hereinafter, controlling CTRL, 504 may involve generating a control voltage and a signal and may, as such, be done in parallel with other phases of the process.

In an embodiment, the stage of controlling CTRLP, 504 the parameter of at least one of the phase detector and the controllable oscillator may comprise the subsequent stages: i) generating GENF1, 518 another signal at the oscillator output of the controllable oscillator, the another signal having a first frequency in a lower half portion of the modulation bandwidth by controlling the controllable frequency divider accordingly, the modulation signal indicates that the required frequency modulation is between a lower frequency and a higher frequency and the modulation bandwidth ranges from the lower frequency to the higher frequency, ii) obtaining OBV1, 520 a first control voltage measurement by measuring the control voltage being generated by the phase detector when the signal having the first frequency is generated, iii) generating GENF2, 522 a further signal at the oscillator output of the controllable oscillator, the further signal having a second frequency in a higher half portion of the modulation bandwidth by controlling the controllable frequency divider accordingly, iv) obtaining OBV2, 524 a second control voltage measurement by measuring the control voltage being generated by the phase detector when the signal having the second frequency is generated, v) calculating CALG1, 526 a gain of the controllable oscillator in dependence of the values of the first frequency and the second frequency and the first and second control voltage measurements, vi) adapt ADG2, 528 the gain of the phase detector such that a product of the gain of the phase detector and the gain of the controllable oscillator is substantially equal to a predetermined constant.

In the foregoing specification, the invention has been described with reference to specific examples of embodiments of the invention. It will, however, be evident that various modifications and changes may be made therein without departing from the broader spirit and scope of the invention as set forth in the appended claims. For example, the connections may be any type of connection suitable to transfer signals from or to the respective nodes, units or devices, for example via intermediate devices. Accordingly, unless implied or stated otherwise the connections may for example be direct connections or indirect connections.

Each signal described herein may have a specific voltage or value representing information which is used by one of the elements of the circuitry. The voltage or value encoding with respect to the information may be predefined according to a specific encoding scheme. For example, a high control voltage may imply that a high frequency signal is generated at the oscillator output and a low control voltage may imply that a low frequency signal is generated at the oscillator output. However, the opposite may also be true when another encoding scheme is defined.

The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

Because the apparatus implementing the present invention is, for the most part, composed of electronic components and circuits known to those skilled in the art, circuit details have not be explained in any greater extent than that considered necessary, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Furthermore, although FIGS. 3 and 4 and the discussion thereof describe an exemplary architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A circuitry for generating a frequency modulated radar transmitter signal, the circuitry comprising
    a reference input to receive a reference signal having a reference frequency,
    a circuitry output to provide the frequency modulated radar transmitter signal,
    a modulation signal generator to generate a modulation signal having a waveform describing a required frequency modulation of the frequency modulated radar transmitter signal, and
    a Phase Locked Loop circuitry to generate the frequency modulated radar transmitter signal in dependence of the modulation signal, the Phase Locked Loop circuitry comprising:
        a controllable oscillator to generate a PLL output signal at an oscillator output, a frequency of the PLL output signal is controlled in dependence of a control voltage,
        a phase detector to generate the control voltage in dependence of a phase difference between a feedback signal and the reference signal,
        a controllable frequency divider to receive the PLL output signal of the oscillator output and generating the feedback signal, a frequency of the feedback signal being substantially equal a frequency of the PLL output signal of the output divided by a controllable factor, the controllable factor being dependent on the modulation signal, and calibration circuitry being configured to control a parameter of the phase detector and a parameter of the controllable oscillator to maintain a loop gain of Phase Locked Loop circuitry, the calibration circuitry includes an analogue-to-digital converter, the calibration circuitry configured to check whether a difference between a second voltage measurement minus a first voltage measurement is smaller than a resolution of the analogue-to-digital converter before calculating a gain of the controllable oscillator.

2. A circuitry according to claim 1, wherein the modulation signal indicates that the required frequency modulation is between a lower frequency and a higher frequency and the calibration circuitry is configured to control the parameter of at least one of the phase detector and the controllable oscillator to obtain a substantially constant product of a gain of the controllable oscillator and a gain of the phase detector across all frequencies in between the lower frequency and the higher frequency.

3. A circuitry according to claim 1, wherein the calibration circuitry is configured to control a gain of the phase detector for maintaining the loop gain in dependence of variations of the gain of the controllable oscillator.

4. A circuitry according to claim 3, wherein the calibration circuitry is configured to:
control the Phase Locked Loop circuitry to generate a signal having a first frequency in a lower half portion of a modulation bandwidth
measure the control voltage for obtaining the first voltage measurement while the signal having the first frequency is generated,
control the Phase Locked Loop circuitry to generate a signal having a second frequency in a higher half portion of the modulation bandwidth,
measure the control voltage for obtaining the second voltage measurement while the signal having the second frequency is generated,
calculate the gain of the controllable oscillator in dependence of the values of the first frequency, the second frequency, the first voltage measurement and second control voltage measurements,
adapt the gain of the phase detector such that a product of the gain of the phase detector and the gain of the controllable oscillator is substantially equal to a predetermined constant.

5. A circuitry according to claim 4, wherein the analogue-to-digital converter further configured to generate a digital value representing an analogue value of the control voltage.

6. A circuitry according to claim 4, wherein the calibration circuitry further comprises a controller for controlling the Phase Locked Loop circuitry to operate at the first frequency and at the second frequency.

7. A circuitry according to claim 4, wherein the calibration circuitry further comprises a first gain calculator for calculating the gain of the controllable oscillator and comprises a second gain calculator for calculating a required gain for the phase detector.

8. A circuitry to generate a frequency modulated radar transmitter signal, the circuitry comprising:
a reference input to receive a reference signal having a reference frequency,
a circuitry output to provide the frequency modulated radar transmitter signal
a modulation signal generator to generate a modulation signal having a waveform describing a required frequency modulation of the frequency modulated radar transmitter signal a Phase Locked Loop circuitry to generate the frequency modulated radar transmitter signal in dependence of the modulation signal, the Phase Locked Loop circuitry comprising:
a controllable oscillator to generate a PLL output signal at an oscillator output, a frequency of the PLL output signal is controlled in dependence of a control voltage,
a phase detector to generate the control voltage in dependence of a phase difference between a feedback signal and the reference signal,
a controllable frequency divider to receive the PLL output signal of the oscillator output and generating the feedback signal, a frequency of the feedback signal being substantially equal a frequency of the PLL output signal of the output divided by a controllable factor, the controllable factor being dependent on the modulation signal,
a calibration circuitry being configured to control a parameter of at least one of the phase detector and the controllable oscillator to maintain a loop gain of Phase Locked Loop circuitry wherein the calibration circuitry comprises an analogue-to-digital converter, wherein the calibration circuitry is configured to, before calculating the gain of the controllable oscillator,
check whether a difference between a second voltage measurement minus a first voltage measurement is smaller than a resolution of the analogue-to-digital converter,
if the a difference between the second voltage measurement minus the first voltage measurement is smaller than the analogue-to-digital converter resolution than a) setting a first frequency to an average of a lower frequency and a higher frequency minus a predefined frequency difference and a second frequency to an average of the lower frequency and the higher frequency plus the predefined frequency difference, b) control the Phase Locked Loop circuitry to generate a signal having the set first frequency, c) measure the control voltage to obtain a first control voltage measurement while the signal having the first frequency is generated, d) control the Phase Locked Loop circuitry to generate a signal having the second frequency, e) measure the control voltage for obtaining a second control voltage measurement while the signal having the second frequency is generated.

9. A circuitry according to claim 1, wherein the calibration circuitry is configured to control a parameter of at least one of the phase detector and the controllable oscillator at least at one of the following moments in time:
shortly after the moment in time when the Phase Locked Loop circuitry or the circuitry for generating the frequency modulated radar transmitter signal is switched on,
shortly before a moment in time when the generation of the frequency modulated radar transmitter signal starts,
in between two chirps of the frequency modulated radar transmitter signal,
after significant changes have been detected in temperature of the circuitry for generating the frequency modulated radar transmitter signal or in a supply voltage level.

10. A circuitry according to claim 1, wherein a low pass filter is provided in between the phase detector and the controllable oscillator for filtering out high frequency variations of the control voltage.

11. A circuitry according to claim 10, wherein the calibration circuitry is configured to control a parameter of the low pass filter to maintain the loop gain.

12. A circuitry according to claim 3, wherein
the phase detector comprises a controllable charge-pump of which a charge-pump gain is controlled,
the calibration circuitry is configured to control the gain of the phase detector by controlling the charge-pump gain.

13. An integrated circuit comprising the circuitry according to claim 1.

14. A radar transceiver circuitry comprising a radar transmitter comprising the circuitry according to claim 1 and comprising a radar receiver.

15. A method of generating a frequency modulated radar transmitter signal, the method comprises:
receiving, at a reference input, a reference signal having a reference frequency,
controlling, by calibration circuitry, a parameter of a phase detector and a parameter of a controllable oscillator to maintain a loop gain of a Phase Locked Loop circuitry comprising the phase detector and the controllable oscillator,
generating, at a modulation signal generator, a modulation signal having a waveform describing a required frequency modulation of the frequency modulated radar transmitter signal,
generating, at a controllable oscillator, a PLL output signal at an oscillator output of the controllable oscillator in dependence of a control voltage,
checking whether a difference between a second voltage measurement minus a first voltage measurement is smaller than a resolution of an analogue-to-digital converter before calculating a gain of the controllable oscillator,
generating, at the phase detector, the control voltage in dependence of a phase difference between a feedback signal an the received reference signal,
generating, at a controllable frequency divider, the feedback signal the generated feedback signal having a frequency being substantially equal to a frequency of the generated PLL output signal at the oscillator output divided by a controllable factor, the controllable factor being dependent on the generated modulation signal,
providing, at a circuitry output, the generated signal of the oscillator output as the frequency modulated radar transmitter signal.

16. A method according to claim 15, wherein controlling a parameter of at least one of the phase detector and the controllable oscillator comprises:
generating another signal at the oscillator output of the controllable oscillator, the another signal having a first frequency in a lower half portion of a modulation bandwidth by controlling the controllable frequency divider accordingly, the modulation signal indicates that the required frequency modulation is between a lower frequency and a higher frequency and the modulation bandwidth ranges from the lower frequency to the higher frequency,
obtaining the first voltage measurement by measuring the control voltage being generated by the phase detector while the signal having the first frequency is generated,
generating a further signal at the oscillator output of the controllable oscillator, the further signal having a second frequency in a higher half portion of the modulation bandwidth by controlling the controllable frequency divider accordingly,
obtaining the second voltage measurement by measuring the control voltage being generated by the phase detector while the signal having the second frequency is generated,
calculating the gain of the controllable oscillator in dependence of the values of the first frequency and the second frequency and the first and second control voltage measurements, and
adapt a gain of the phase detector such that a product of the gain of the phase detector and the gain of the controllable oscillator is substantially equal to a predetermined constant.

* * * * *